United States Patent
Goto et al.

(10) Patent No.: US 7,154,272 B2
(45) Date of Patent: Dec. 26, 2006

(54) METHOD FOR CONTROLLING STATIC MAGNETIC FIELD AND MRI APPARATUS

(75) Inventors: Takao Goto, Tokyo (JP); Takami Sato, Tokyo (JP)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 0 days.

(21) Appl. No.: 11/124,880

(22) Filed: May 9, 2005

(65) Prior Publication Data

US 2005/0258833 A1  Nov. 24, 2005

(30) Foreign Application Priority Data

May 24, 2004  (JP)  ............... 2004-153333

(51) Int. Cl.
*G01V 3/00* (2006.01)
(52) U.S. Cl. ................... 324/319; 335/296
(58) Field of Classification Search ........... 324/319, 324/320; 335/296
See application file for complete search history.

(56) References Cited

U.S. PATENT DOCUMENTS

| | | | |
|---|---|---|---|
| 4,672,346 A | 6/1987 | Miyamoto et al. | |
| 4,679,022 A * | 7/1987 | Miyamoto et al. | 335/296 |
| 4,899,110 A | 2/1990 | Furukawa | |
| 5,134,374 A * | 7/1992 | Breneman et al. | 324/319 |
| 5,438,264 A | 8/1995 | Takeshima et al. | |
| 5,773,976 A | 6/1998 | Sakakura et al. | |
| 5,876,337 A | 3/1999 | Tsuda | |
| 6,147,578 A | 11/2000 | Panfil et al. | |
| 6,333,630 B1 * | 12/2001 | Holsinger et al. | 324/319 |
| 6,696,385 B1 | 2/2004 | Hayashi et al. | |
| 6,700,376 B1 | 3/2004 | Goto et al. | |
| 6,707,301 B1 | 3/2004 | Goto | |
| 6,744,252 B1 | 6/2004 | Goto | |

FOREIGN PATENT DOCUMENTS

| | | |
|---|---|---|
| JP | SHOWA 61-88210 | 9/1986 |
| JP | 02-117106 | 5/1990 |
| JP | 02-117107 | 5/1990 |
| JP | 09-028688 | 2/1997 |
| JP | 2002-345776 | 12/2002 |
| JP | 2003-168604 | 6/2003 |

OTHER PUBLICATIONS

International Search Report; dated Sep. 21, 2005; U.S. Appl. No. 05253057.3-2209 PCT/; Place of Search—Munich; 5 pgs.
English Translation of JP Laid Open Number Showa 61-88210.

* cited by examiner

*Primary Examiner*—Louis M. Arana
(74) *Attorney, Agent, or Firm*—Carl B. Horton, Esq.; Armstrong Teasdale LLP

(57) ABSTRACT

A Magnetic Resonance Imaging system includes a plurality of auxiliary magnets that are disposed around the main magnets to adjust the interval between the main magnet and the auxiliary magnets and the interval between the main magnet and the auxiliary magnets respectively.

17 Claims, 5 Drawing Sheets

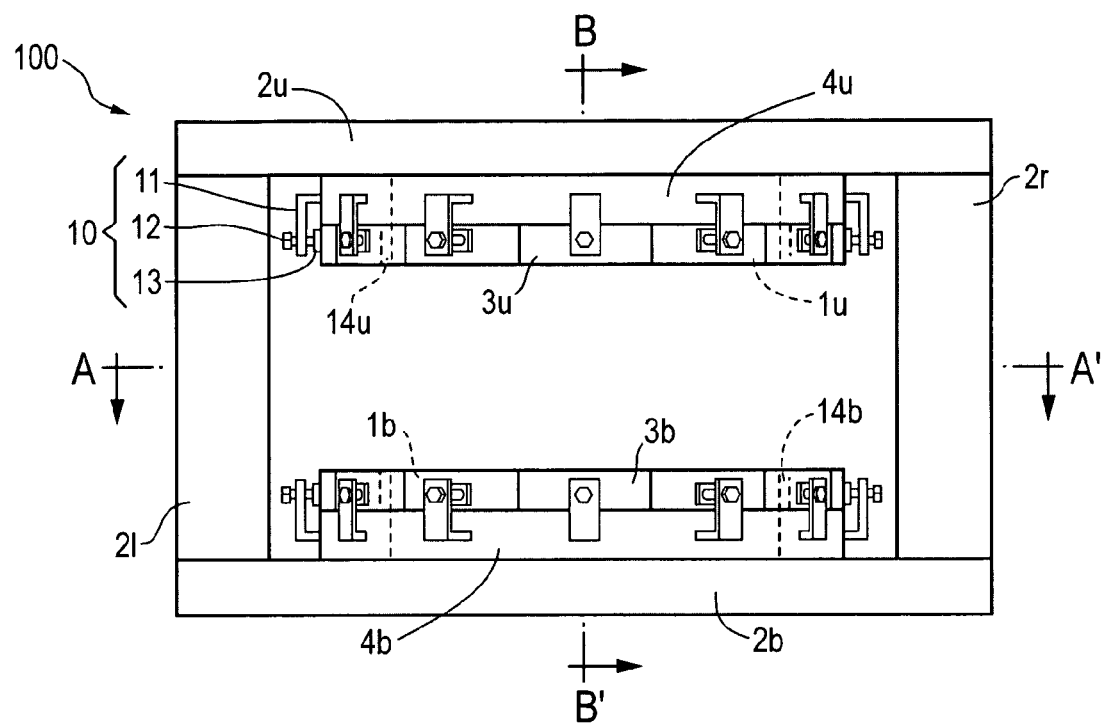
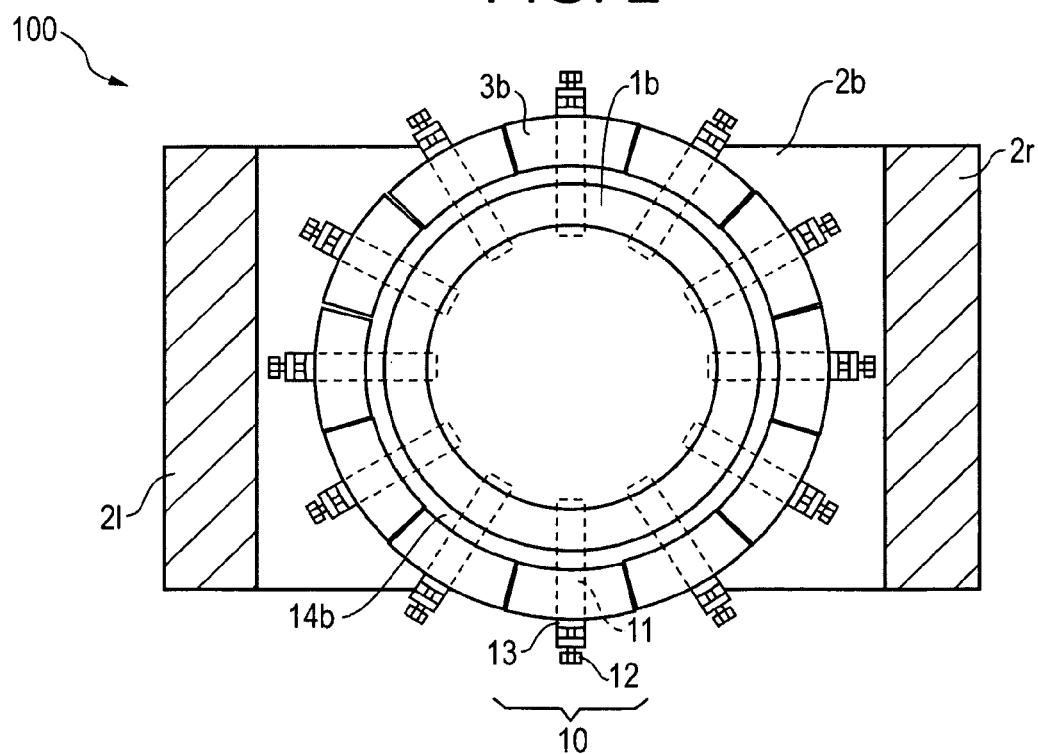

METHOD FOR CONTROLLING STATIC MAGNETIC FIELD AND MRI APPARATUS

CROSS REFERENCE TO RELATED APPLICATIONS

This application claims the benefit of Japanese Application No. 2004-153333 filed May 24, 2004.

BACKGROUND OF THE INVENTION

The present invention relates to a static magnetic field control method and an MRI (Magnetic Resonance Imaging) apparatus, and more specifically to a static magnetic field control method and an MRI apparatus both capable of sufficiently obtaining the effect of shaping static magnetic fields and the effect of preventing a magnetic leakage flux.

There has heretofore been known a magnetic field generator wherein leakage flux preventing auxiliary magnets are provided outside magnetic plates placed on opposite surfaces of main magnets of a static magnetic field generating magnet (see patent document 1).

[Patent Document 1] Japanese Unexamined Patent Publication No. 2003-168604.

In the conventional magnetic field generator, magnetic plates are provided on opposite surfaces of main magnets, static magnetic fields are shaped in some measure by the magnetic plates, and auxiliary magnets are provided thereon to prevent leakage flux.

However, a problem arises in that when the magnetic plates are taken off for simplification of a configuration of the magnetic field generator, the effect of shaping the static magnetic fields and the effect of preventing the leakage flux cannot be sufficiently obtained in the case of the auxiliary magnets alone.

SUMMARY OF THE INVENTION

Therefore, an object of the present invention is to provide a static magnetic field control method and an MRI apparatus both capable of sufficiently obtaining the effect of shaping static magnetic fields and the effect of preventing leakage flux even when magnetic plates are taken off.

According to a first aspect, the present invention provides a static magnetic field control method comprising the steps of disposing a plurality of auxiliary magnets set to directions repellent to main magnets around the main magnets of a static magnetic field generating magnet, adjusting intervals among the main magnets and auxiliary magnets respectively to thereby shape static magnetic fields, and suppressing magnetic fields that leak to the peripheries of the main magnets.

In the static magnetic field control method according to the first aspect, the plurality of auxiliary magnets are disposed around the main magnets of the static magnetic field generating magnet so as to take the directions repellent to the main magnets. Then, the intervals among the main magnets and the auxiliary magnets are adjusted in such a manner that the static magnetic fields are shaped and expanded to the peripheries of the main magnets, and the leakage flux is canceled out. Consequently, the effect of shaping the static magnetic fields and the effect of preventing the leakage flux can be sufficiently obtained.

According to a second aspect, the present invention provides a static magnetic field control method wherein in the static magnetic field control method having the above configuration, spacers are interposed among the main magnets and the auxiliary magnets respectively.

In the static magnetic field control method according to the second aspect, the spacers are respectively interposed among the main magnets and the auxiliary magnets to make it easy to fix the positions of the auxiliary magnets after the adjustment of the intervals.

According to a third aspect, the present invention provides a static magnetic field control method wherein in static magnetic field control method having the above configuration, each of the spacers does not contain a magnetic body.

In the static magnetic field control method according to the third aspect, the spacers do not influence the magnetic fields.

According to a fourth aspect, the present invention provides a static magnetic field control method wherein in the static magnetic field control method having the above configuration, each of the spacers includes a magnetic body.

In the static magnetic field control method according to the fourth aspect, the magnetic fields can be adjusted even by the spacers.

According to a fifth aspect, the present invention provides a static magnetic field control method wherein in the static magnetic field control method having the above configuration, a gap is defined between the main magnet and the auxiliary magnet.

In the static magnetic field control method according to the fifth aspect, readjustments to the intervals can be freely performed.

According to a sixth aspect, the present invention provides an MRI apparatus comprising a pair of main magnets of which the front surfaces are opposite to each other with a gap with an object placed therein being interposed therebetween, yokes which magnetically connect back surfaces of the main magnets, a plurality of auxiliary magnets respectively disposed around the main magnets in directions repellent to the main magnets, and interval control means which adjust the intervals among the main magnets and the auxiliary magnets respectively.

In the MRI apparatus according to the sixth aspect, the intervals among the main magnets and the auxiliary magnets are adjusted so that the static magnetic fields can be shaped and the magnetic fields that leak so as to expand to the peripheries of the main magnets can be suppressed.

According to a seventh aspect, the present invention provides an MRI apparatus wherein in the MRI apparatus having the above configuration, each of the main magnets has a frontal peripheral edge portion having a shape that protrudes than a central portion thereof.

In the MRI apparatus according to the seventh aspect, the uniformity of static magnetic fields can be improved by the shapes of the main magnets.

According to an eighth aspect, the present invention provides an MRI apparatus wherein in the MRI apparatus having the above configuration, the front surface of one of the main magnets has a magnetic pole corresponding to an S pole, and the front surface of the other thereof has a magnetic pole corresponding to an N pole.

In the MRI apparatus according to the eighth aspect, static magnetic fields can be suitably generated in a space in which an object enters.

According to a ninth aspect, the present invention provides an MRI apparatus wherein in the MRI apparatus having the above configuration, the magnetization directions of the main magnets correspond to directions in which the pair of main magnets is opposed to each other.

In the MRI apparatus according to the ninth aspect, strong static magnetic fields can suitably be generated in a space in which an object enters.

According to a tenth aspect, the present invention provides an MRI apparatus wherein in the MRI apparatus having the above configuration, the outside of each of the auxiliary magnets disposed around the corresponding main magnet having the S pole at the front surface thereof has a magnetic pole corresponding to an N pole, and the outside of each of the auxiliary magnets disposed around the corresponding main magnet having the N pole at the front surface thereof has a magnetic pole corresponding to an S pole.

The MRI apparatus according to the tenth aspect is capable of shaping static magnetic fields inside the main magnet according to a field direction of the main magnet and a field direction of each auxiliary magnet and suitably suppressing the leakage of magnetic fields around the main magnet.

According to an eleventh aspect, the present invention provides an MRI apparatus wherein in the MRI apparatus having the above configuration, the magnetization directions of the auxiliary magnets correspond to directions aslant inclined toward the center of a space in which the object enters from the direction orthogonal to the opposite directions of the pair of main magnets.

In the MRI apparatus according to the eleventh aspect, the magnetization directions of the auxiliary magnets are tilted to thereby make it possible to shape static magnetic fields inside the main magnets and suitably suppress the leakage of magnetic fields around the main magnets.

According to a twelfth aspect, the present invention provides an MRI apparatus wherein in the MRI apparatus having the above configuration, the magnetization directions of the auxiliary magnets correspond to the direction orthogonal to the opposite directions of the pair of main magnets.

The MRI apparatus according to the twelfth aspect becomes easy to handle because the magnetization directions of the auxiliary magnets are easy to be determined.

According to a thirteenth aspect, the present invention provides an MRI apparatus wherein in the MRI apparatus having the above configuration, a spacer is interposed between the corresponding main magnet and the auxiliary magnets disposed therearound.

In the MRI apparatus according to the thirteenth aspect, the spacer is interposed between the corresponding main magnet and the auxiliary magnets, whereby the positions of the auxiliary magnets become easy to fix after interval adjustments.

According to a fourteenth aspect, the present invention provides an MRI apparatus wherein in the MRI apparatus having the above configuration, the spacer does not contain a magnetic body.

In the MRI apparatus according to the fourteenth aspect, the spacer does not influence the magnetic fields.

According to a fifteenth aspect, the present invention provides an MRI apparatus wherein in the MRI apparatus having the above configuration, the spacer includes a magnetic body.

In the MRI apparatus according to the fifteenth aspect, the magnetic fields can be adjusted even by the spacer.

According to a sixteenth aspect, the present invention provides an MRI apparatus wherein in the MRI apparatus having the above configuration, gaps are respectively defined between the main magnets and the auxiliary magnets disposed therearound.

In the static magnetic field control method according to the fifth aspect, readjustments to the intervals can freely be performed.

According to the static magnetic field control method and the MRI apparatus of the present invention, magnetic fields that leak so as to expand to the peripheries of main magnets can be suppressed.

A static magnetic field control method and an MRI apparatus according to the present invention can be used in photographing of an MR image.

Further objects and advantages of the present invention will be apparent from the following description of the preferred embodiments of the invention as illustrated in the accompanying drawings.

BRIEF DESCRIPTION OF THE DRAWINGS

FIG. 1 is a front view showing a static magnetic field generating magnet of an MRI apparatus according to an embodiment 1.

FIG. 2 is a cross-sectional view taken along line A–A' of FIG. 1.

DETAILED DESCRIPTION OF THE INVENTION

The present invention will hereinafter be described in further detail by embodiments illustrated in the accompanying drawings. Incidentally, these do not limit the present invention.

[Embodiment 1]

Figure 3:
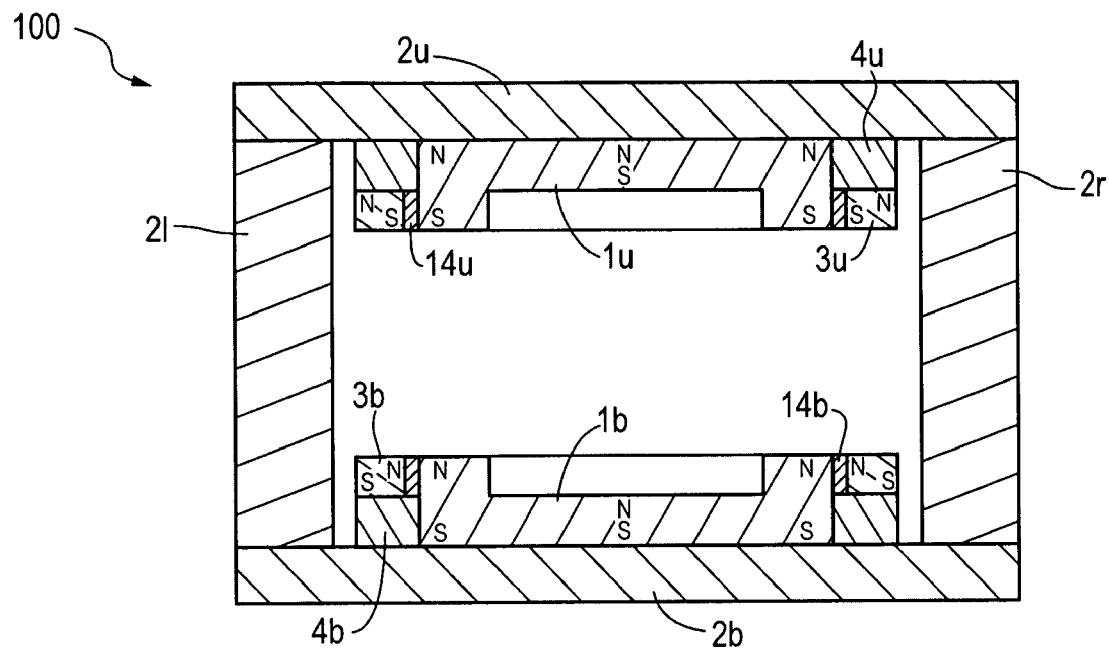
FIG. 3 is a cross-sectional view taken along line B–B' of FIG. 1.

FIG. 1 is a front view showing a static magnetic field generating magnet section of an MRI apparatus 100 according to an embodiment 1. FIG. 2 is a cross-sectional view taken along line A–A' of FIG. 1. FIG. 3 is a sectional typical view taken along line B–B' of FIG. 1.

The MRI apparatus 100 is equipped with an upper main magnet 1$u$ and a lower main magnet 1$b$ of which the front surfaces are opposite to each other in the vertical direction with a space with an object placed therein being interposed therebetween, an upper yoke 2$u$, a right yoke 2$r$, a lower yoke 2$b$ and a left yoke 2$l$ which magnetically connect the back surfaces of the main magnets 1$u$ and 1$b$, a plurality of upper auxiliary magnets 3$u$ disposed around the upper main magnet 1$u$, an upper support table 4$u$ for fixing the height of each upper auxiliary magnet 3$u$ with respect to the upper yoke 2$u$, a plurality of lower auxiliary magnets 3$b$ disposed around the lower main magnet 1$b$, a lower support table 4$b$ for fixing the height of each lower auxiliary magnet 3$b$ with respect to the lower yoke 2$b$, interval adjustment mechanisms 10 provided every auxiliary magnets to adjust the interval between the upper main magnet 1u and each upper auxiliary magnet 3u and the interval between the lower main magnet 1b and each lower auxiliary magnet 3b, and an upper spacer 14u provided with being interposed between the upper main magnet 1u and the upper auxiliary magnets 3u, and a lower spacer 14b provided with being interposed between the lower main magnet 1b and the lower auxiliary magnets 3b.

Each of the main magnets 1u and 1b is shaped in the form of a disk in which a peripheral edge portion of its front surface protrudes from its central portion.

As typically illustrated in FIG. 3 (L members 11, bolts 12 and presser plates 13 are omitted), the magnetization directions of the main magnets 1u and 1b are placed in the vertical direction. The front surface of the upper main magnet 1u has a magnetic pole corresponding to an S pole, and the front surface of the lower main magnet 1b has a magnetic pole corresponding to an N pole.

The auxiliary magnets 3u and 3b take ring-divided shapes.

As shown in FIG. 3, the magnetization directions of the auxiliary magnets 3u and 3b correspond to the directions aslant inclined to the center side of the space in which the object enters from the horizontal direction. The outside of the upper auxiliary magnet 3u has a magnetic pole corresponding to an N pole, and the outside of the lower auxiliary magnet 3b has a magnetic pole corresponding to an S pole.

A material of the main magnets 1u and 1b and the auxiliary magnets 3u and 3b is, for example, neodymium (Nd—Fe—B) magnet material, a samarium-cobalt (SmCo) magnet material, alnico (MK steel) magnet material or a ferritic magnet material.

A material of the support tables 4u and 4b is plastic, and is, for example, of any of PolyPropylene, PolyButylene Terephthalate, ABS (Acrylonitrile Butadiene Styrene) resin, PolyEthylene, PolyStyrene, polymethylpentene, polyacetals, PolyVinyl Choride, PolyPhenyleneEther, or a combination of two or more of these.

Each of the interval adjustment mechanisms 10 comprises the L member 11, bolt 12 and presser plate 13.

As shown in FIGS. 1 and 2, part of the L member 11 corresponding to each lower auxiliary magnet 3b is embedded into its corresponding lower support table 4b. The bolt 12 is maintained in meshing engagement with the L member 11. The lower auxiliary magnet 3b repels the lower main magnet 1b by a magnetic force but is supported by the lower support table 4b against its repulsion through the presser plate 13, bolt 12 and L member 11. Since the positions of the lower main magnet 1b and the lower support table 4b are fixed, the position of the lower auxiliary magnet 3b with respect to the lower main magnet 1b can be adjusted by turning the bolt 12.

A relationship among the upper main magnet 1u, the upper support table 4u and the upper auxiliary magnets 3u is also similar to the above.

The upper spacer 14u and the lower spacer 14b are formed by adjusting the positions of the upper auxiliary magnets 3u with respect to the upper main magnet 1u and the positions of the lower auxiliary magnets 3b with respect to the lower main magnet 1b and thereafter charging an adhesive (e.g., epoxy resin).

Incidentally, a filler (e.g., plastic bead) corresponding to a non-magnetic material or body may be mixed into the adhesive.

Figure 4:
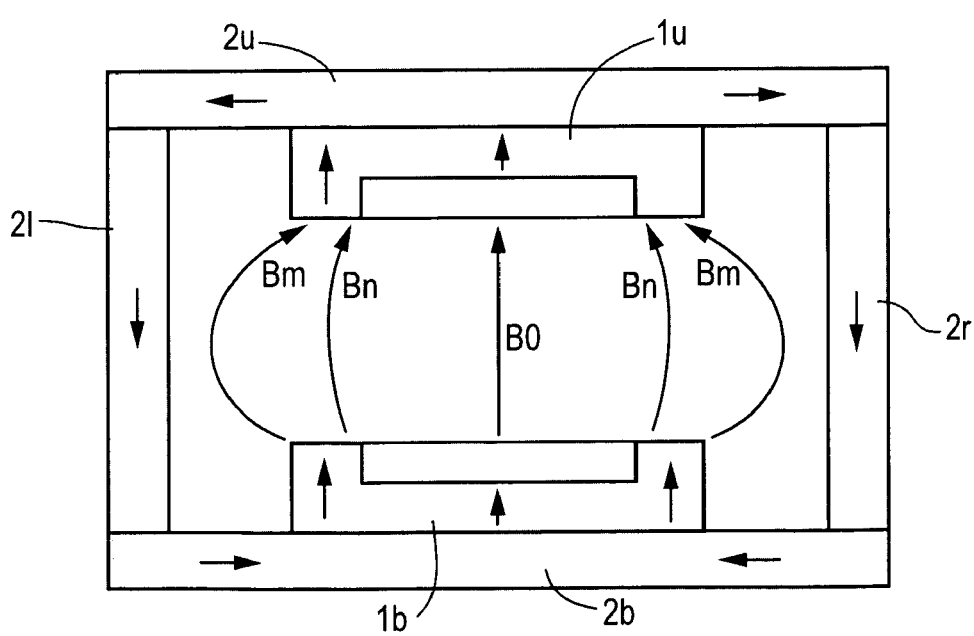
FIG. 4 is an explanatory view showing magnetic fields formed by main magnets.

Black arrows in FIG. 4 indicate magnetic fields formed by the main magnets 1u and 1b.

The main magnets 1u and 1b form a vertically-extending static magnetic field B0 in the center of the space in which the object enters. However, magnetic fields Bn and Bm are expanded outside around the main magnets 1u and 1b.

Figure 5:
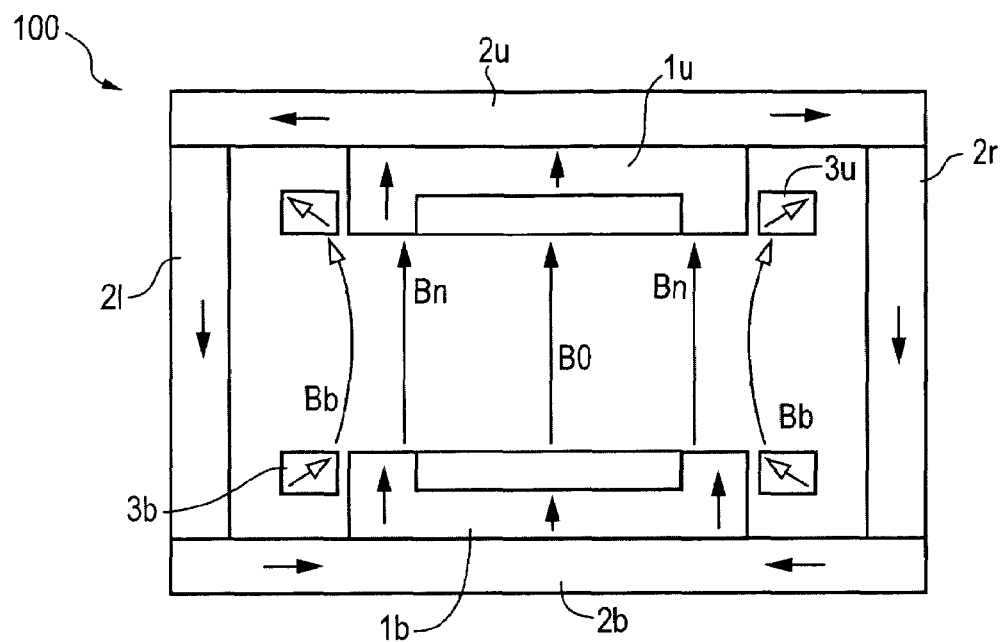
FIG. 5 is an explanatory view illustrating the effect of uniformizing magnetic fields by auxiliary magnets.

Magnetic fields formed by the auxiliary magnets 3u and 3b are indicated by white arrows in FIG. 5.

Since the magnetic fields Bb formed inside the main magnets 1u and 1b by the auxiliary magnets 3u and 3b become identical in direction to the magnetic fields Bn formed by the main magnets 1u and 1b, they bring the magnetic fields Bn intended to expand outside back down to their inner sides. If the interval between the upper main magnet 1u and each of the upper auxiliary magnets 3u and the interval between the lower main magnet 1b and each of the lower auxiliary magnets 3b are adjusted, then uniformity of the magnetic fields Bn can be improved.

Figure 6:
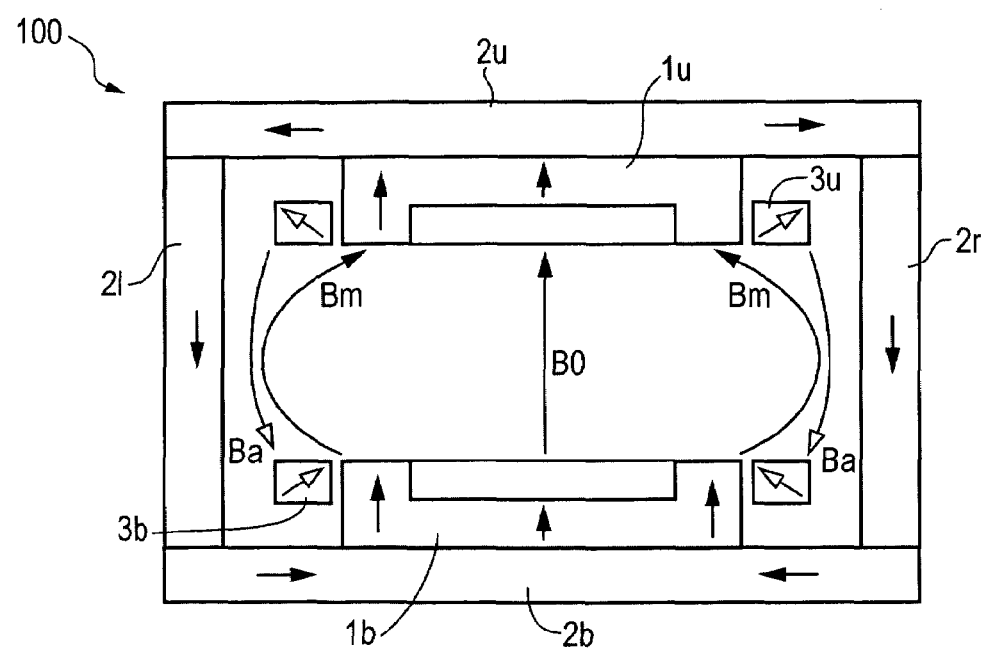
FIG. 6 is an explanatory view showing the effect of suppressing leak magnetic fields by auxiliary magnets.

Further, although magnetic fields Ba formed around the main magnets 1u and 1b by the auxiliary magnets 3u and 3b expands outside as shown in FIG. 6 in a manner similar to the magnetic fields Bm of the main magnets 1u and 1b, they are opposite in polarity. Therefore, the magnetic fields Ba formed outside by the auxiliary magnets 3u and 3b cancel out the magnetic fields Bm of the main magnets 1u and 1b. If the interval between the upper main magnet 1u and each of the upper auxiliary magnets 3u and the interval between the lower main magnet 1b and each of the lower auxiliary magnets 3b are adjusted, then the magnetic fields Bm that leak so as to expand outward toward the peripheries of the main magnets 1u and 1b can be suppressed.

[Embodiment 2]

Spacers 14u and 14b may be formed of an adhesive mixed with a filler (e.g., ferrite bead) corresponding to a magnetic body.

Varying the material for the magnetic body and the amount of mixing thereof makes it possible to control the effects of auxiliary magnets 3u and 3b.

[Embodiment 3]

Figure 7:
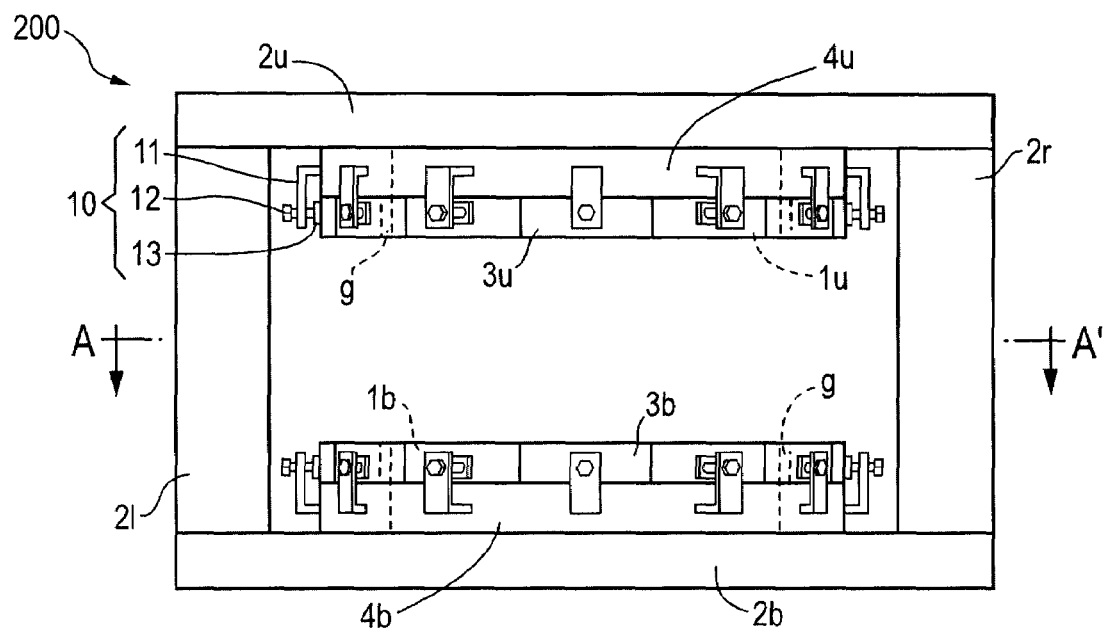
FIG. 7 is a front view showing a static magnetic field generating magnet of an MRI apparatus according to an embodiment 3.
Figure 8:
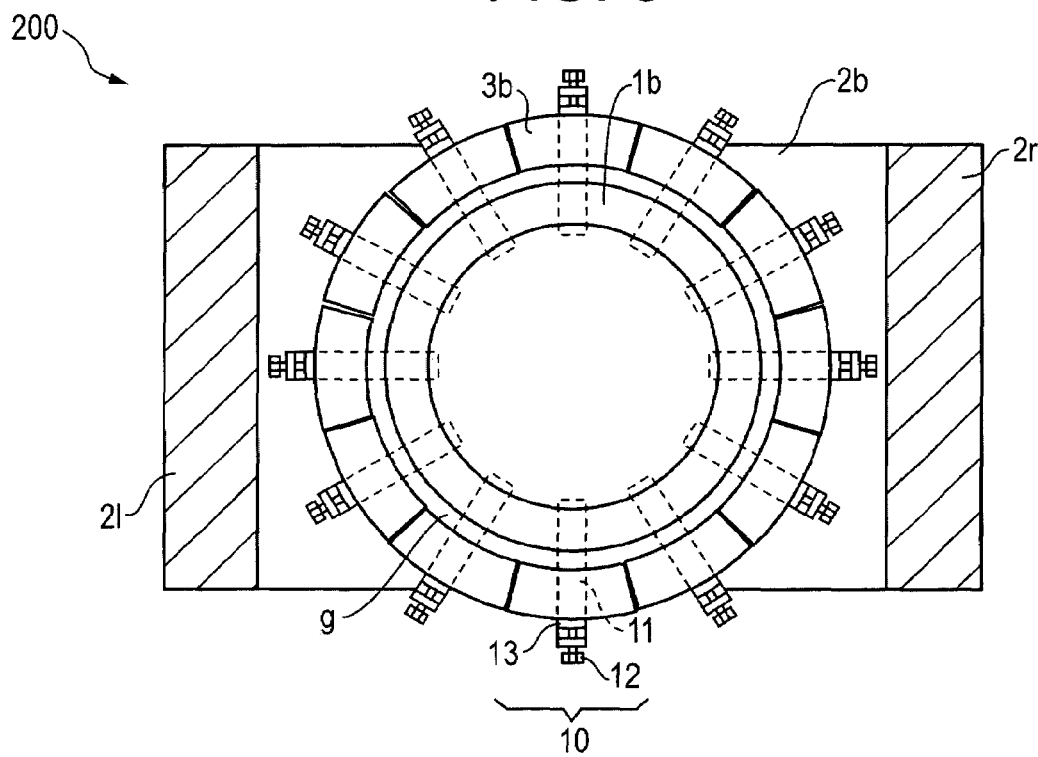
FIG. 8 is a cross-sectional view taken along line A–A' of FIG. 7.

FIGS. 7 and 8 respectively show an MRI apparatus 200 according to an embodiment 3.

The MRI apparatus 200 has a gap g defined between an upper main magnet 1u and upper auxiliary magnets 3u and a gap g defined between a lower main magnet 1b and lower auxiliary magnets 3b.

[Embodiment 4]

Figure 9:
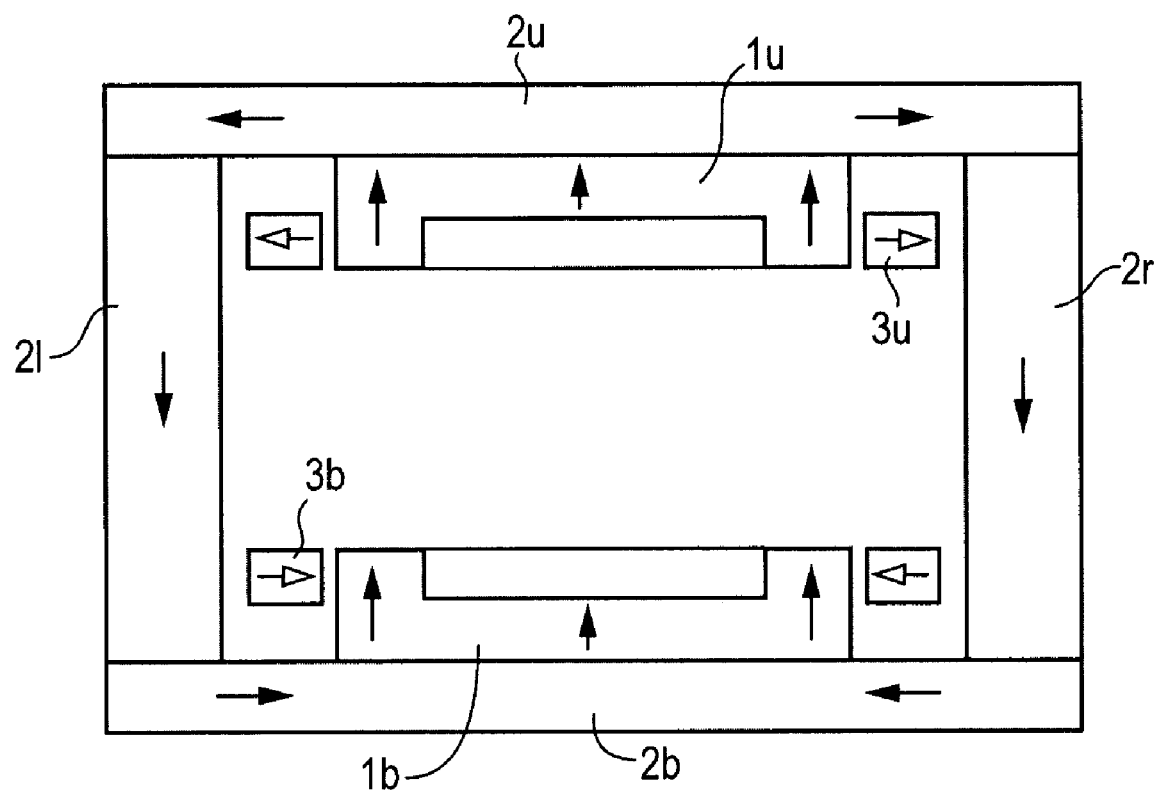
FIG. 9 is an explanatory view showing magnetization directions of auxiliary magnets of an MRI apparatus according to an embodiment 4.

As shown in FIG. 9, the magnetization directions of auxiliary magnets 3u and 3b may be set to the horizontal direction.

Many widely different embodiments of the invention may be configured without departing from the spirit and the scope of the present invention. It should be understood that the present invention is not limited to the specific embodiments described in the specification, except as defined in the appended claims.

The invention claimed is:

1. A static magnetic field control method comprising the steps of:

disposing a plurality of auxiliary magnets set to directions repellent to main magnets around the main magnets of a static magnetic field generating magnet, wherein a first one of the main magnets has a shape of a disk including a central portion and a peripheral portion protruding from the central portion towards a space between the main magnets, wherein the peripheral portion is integrated with the first one of the main magnets;

adjusting intervals among the main magnets and auxiliary magnets respectively to thereby shape static magnetic fields; and suppressing magnetic fields that leak to the peripheries of the main magnets.

2. The static magnetic field control method according to claim 1, wherein spacers are interposed among the main magnets and the auxiliary magnets respectively.

3. The static magnetic field control method according to claim 2, wherein each of the spacers does not contain a magnetic body.

4. The static magnetic field control method according to claim 2, wherein each of the spacers includes a magnetic body.

5. The static magnetic field control method according to claim 2, wherein one of the spacers includes at least one of an adhesive and a combination of an adhesive and a filler.

6. The static magnetic field control method according to claim 1, wherein a gap is defined between the main magnet and the auxiliary magnet.

7. An MRI apparatus comprising:

a pair of main magnets of which the front surfaces are opposite to each other with a gap with an object placed therein being interposed therebetween, wherein a first one of the main magnets has a shape of a disk including a central portion and a peripheral portion protruding from the central portion towards the gap between the main magnets, wherein the peripheral portion is integrated with the first one of the main magnets;

yokes which magnetically connect back surfaces of the main magnets;

a plurality of auxiliary magnets respectively disposed around the main magnets in directions repellent to the main magnets; and an interval control device which adjust the intervals among the main magnets and the auxiliary magnets respectively.

8. The MRI apparatus according to claim 7, wherein a second one of the main magnets has a frontal peripheral edge portion having a shape that protrudes than a central portion thereof.

9. The MRI apparatus according to claim 7, wherein the front surface of one of the main magnets has a magnetic pole corresponding to an S pole, and the front surface of the other thereof has a magnetic pole corresponding to an N pole.

10. The MRI apparatus according to claim 9, wherein the magnetization directions of the main magnets correspond to directions in which the pair of main magnets is opposed to each other.

11. The MRI apparatus according to claim 7, wherein the outside of each of the auxiliary magnets disposed around the corresponding main magnet having the S pole at the front surface thereof has a magnetic pole corresponding to an N pole, and the outside of each of the auxiliary magnets disposed around the corresponding main magnet having the N pole at the front surface thereof has a magnetic pole corresponding to an S pole.

12. The MRI apparatus according to claim 11, wherein the magnetization directions of the auxiliary magnets correspond to directions aslant inclined toward the center of a space in which the object enters from the direction orthogonal to the opposite directions of the pair of main magnets.

13. The MRI apparatus according to claim 11, wherein the magnetization directions of the auxiliary magnets correspond to the direction orthogonal to the opposite directions of the pair of main magnets.

14. The MRI apparatus according to claim 7, wherein a spacer is interposed between the corresponding main magnet and the auxiliary magnets disposed therearound.

15. The MRI apparatus according to claim 14, wherein the spacer does not contain a magnetic body.

16. The MRI apparatus according to claim 14, wherein the spacer includes a magnetic body.

17. The MRI apparatus according to claim 7, wherein gaps are respectively defined between the main magnets and the auxiliary magnets disposed therearound.

* * * * *